(12) United States Patent
Lin et al.

(10) Patent No.: US 8,183,519 B2
(45) Date of Patent: May 22, 2012

(54) LIGHT CONCENTRATING MODULE

(75) Inventors: Hui-Hsiung Lin, Hsinchu County (TW); Wen-Hsun Yang, Taipei (TW); Yu-Nan Pao, Hsinchu County (TW); Chia-Jen Ting, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 572 days.

(21) Appl. No.: 12/408,653

(22) Filed: Mar. 20, 2009

(65) Prior Publication Data
US 2010/0133422 A1 Jun. 3, 2010

(30) Foreign Application Priority Data

Dec. 3, 2008 (TW) .............................. 97146881 A (51) Int. Cl.
*G02B 6/42* (2006.01)
*F21V 8/00* (2006.01)
(52) U.S. Cl. ................... 250/227.11; 136/246
(58) Field of Classification Search .................. 250/216, 250/227.11, 227.31; 126/684, 687; 136/246; 359/837
See application file for complete search history.

(56) References Cited

U.S. PATENT DOCUMENTS

| | | | |
|---|---|---|---|
| 4,344,417 A | 8/1982 | Malecek | |
| 4,966,812 A * | 10/1990 | Ashley et al. | 428/412 |
| 5,646,397 A | 7/1997 | Wenham et al. | |
| 5,877,874 A * | 3/1999 | Rosenberg | 359/15 |
| 6,025,583 A * | 2/2000 | Whitehead | 250/203.4 |
| 6,323,415 B1 * | 11/2001 | Uematsu et al. | 136/246 |
| 6,359,735 B1 | 3/2002 | Gombert et al. | |
| 6,619,282 B1 | 9/2003 | Murtha | |
| 6,971,756 B2 | 12/2005 | Vasylyev et al. | |
| 6,997,018 B2 | 2/2006 | Sakoske et al. | |
| 7,190,531 B2 | 3/2007 | Dyson et al. | |
| 7,300,022 B2 | 11/2007 | Muller | |
| 7,649,665 B2 * | 1/2010 | Kempa et al. | 359/245 |
| 2005/0074579 A1 | 4/2005 | Suzuki et al. | |
| 2006/0191566 A1 * | 8/2006 | Schaafsma | 136/246 |
| 2007/0227581 A1 | 10/2007 | Chen et al. | |
| 2007/0240755 A1 * | 10/2007 | Lichy | 136/246 |

(Continued)

FOREIGN PATENT DOCUMENTS

CN 1492854 (A) 4/2004

(Continued)

OTHER PUBLICATIONS

Germany Patent Office, Office Action, Patent Application Serial No. 102009001976.6-51, Mar. 11, 2011, Germany.

(Continued)

*Primary Examiner* — John Lee (57) ABSTRACT

A light concentrating module includes an optical film having a light incident surface and a light outgoing surface facing the light incident surface, an optical wedge element having a first surface, a second surface facing the first surface and having an angle with respect to the first surface and a third surface adjacent to the first and second surfaces, and at least one photoelectric chip disposed near the third surface. Light from a light source penetrates the optical film, and the light enters the first surface of the optical wedge element by an appropriate incident angle and has total reflection between the first and second surfaces, whereby the light propagates in the optical wedge element, and the light leaves the optical wedge element from the third surface and is received by the photoelectric chip.

14 Claims, 6 Drawing Sheets

U.S. PATENT DOCUMENTS

| | | | |
|---|---|---|---|
| 2008/0257400 A1* | 10/2008 | Mignon et al. | 136/246 |
| 2008/0271776 A1 | 11/2008 | Morgan | |
| 2008/0302416 A1* | 12/2008 | Wolfe et al. | 136/256 |
| 2009/0032087 A1* | 2/2009 | Kalejs | 136/246 |
| 2009/0178704 A1* | 7/2009 | Kalejs et al. | 136/246 |
| 2009/0194096 A1* | 8/2009 | Simon | 126/684 |
| 2009/0235974 A1* | 9/2009 | Mapel et al. | 136/246 |
| 2009/0250093 A1* | 10/2009 | Chen | 136/246 |
| 2009/0283133 A1* | 11/2009 | Hebrink et al. | 136/246 |
| 2010/0024805 A1* | 2/2010 | Raymond et al. | 126/683 |
| 2010/0133422 A1* | 6/2010 | Lin et al. | 250/227.11 |
| 2010/0224231 A1* | 9/2010 | Hoke | 136/246 |
| 2011/0048411 A1* | 3/2011 | Walker | 126/698 |

FOREIGN PATENT DOCUMENTS

| | | |
|---|---|---|
| DE | 2827708 A1 | 1/1979 |
| DE | 19915209 A1 | 10/2000 |

OTHER PUBLICATIONS

China Patent Office, Office Action, Patent Application Serial No. 200810188102.5, Dec. 6, 2010, China.

* cited by examiner

LIGHT CONCENTRATING MODULE

CROSS REFERENCE TO RELATED APPLICATIONS

This Application claims priority of Taiwan Patent Application No. 97146881; filed on Dec. 3, 2008, the entirety of which is incorporated by reference herein.

BACKGROUND OF THE INVENTION

1. Field of the Invention

The invention relates to a light concentrating module, and in particular relates to a light concentrating module varying the incident angle of light entering an optical wedge plate with an optical film to make the light propagate in the optical wedge plate by total reflection.

2. Description of the Related Art

Due to rising petroleum prices and decreasing raw material supplies, new energy sources have been developed. Of which, solar energy has become a popular choice.

U.S. Pat. No. 7,190,531 discloses a solar energy collecting system utilizing a Fresnel lens to gather solar light to a solar chip. Such a solar energy collecting system is often equipped with a solar tracking system that directs the solar chip to always face the sun, thereby increasing solar energy collection efficiency. However, such a system is very heavy and has limited applications.

U.S. Pat. No. 6,971,756 discloses a radiation energy collecting and transferring device utilizing mirrors to collect solar light. When the solar light reaches the mirrors, it is reflected to the solar chip. The mirrors change inclined angles to track the sun. Such a system, however, still requires a solar tracking system, which makes the system very heavy.

U.S. Pat. No. 6,619,282 discloses a solar energy collecting system utilizing water to conduct solar light and constrain the angle of the solar light. The solar light is conducted to the lateral side of the device. Although such a device occupies a smaller volume, water is needed.

BRIEF SUMMARY OF INVENTION

An embodiment of a light concentrating module comprises an optical film having a light incident surface and a light outgoing surface facing the light incident surface, an optical wedge element having a first surface, a second surface facing the first surface and having an angle with respect to the first surface and a third surface adjacent to the first and second surfaces, and at least one photoelectric chip disposed near the third surface. Light from a light source penetrates the optical film, and the light enters the first surface of the optical wedge element by an appropriate incident angle and has total reflection between the first and second surfaces, whereby the light propagates in the optical wedge element, and the light leaves the optical wedge element from the third surface and is received by the photoelectric chip.

The angle between the first and second surfaces is larger than 0 degrees and smaller than 80 degrees.

The photoelectric chip comprises chemical elements listed in the column III or V of the periodic table.

A micro structure is formed on the third surface, and light passes through the micro structure to increase the light collected by the photoelectric chip.

The optical film comprises transparent material, and the optical wedge element comprises transparent material.

A micro/nano scale structure is formed on the light incident surface, and the micro/nano scale structure comprises a micro/nano layer formed on the optical film. The micro/nano layer comprises a plurality of three-dimensional structures with a cross section having a width that is gradually large from a top to bottom portion, wherein the three dimensional structure has a period of 100~600 nm and a height of 100~570 nm.

The micro/nano-scale structure further comprises a metal layer formed on the micro/nano layer. The metal layer comprises gold, silver, aluminum, nickel, copper, chromium, tin oxide or ITO.

The micro/nano scale structure further comprises a hard coating coated on the metal layer.

The light incident surface is coated by a water repellent material comprising polyvinylidene fluoride, polysulfone, reactive modifying agent with a water-free polymer, silicon rubber, Acrylonitrile-Butadien-Styrene, or PTFE.

The light leaves the optical film by an angle larger than 50 degrees and smaller than 90 degrees.

A micro structure is formed on the light outgoing surface. The cross section of the micro structure is V-shaped, or the micro structure is a Fresnel lens structure.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIGS. 4 and 5 depict a micro structure formed on a light outgoing surface, wherein

DETAILED DESCRIPTION OF INVENTION

Figure 1:
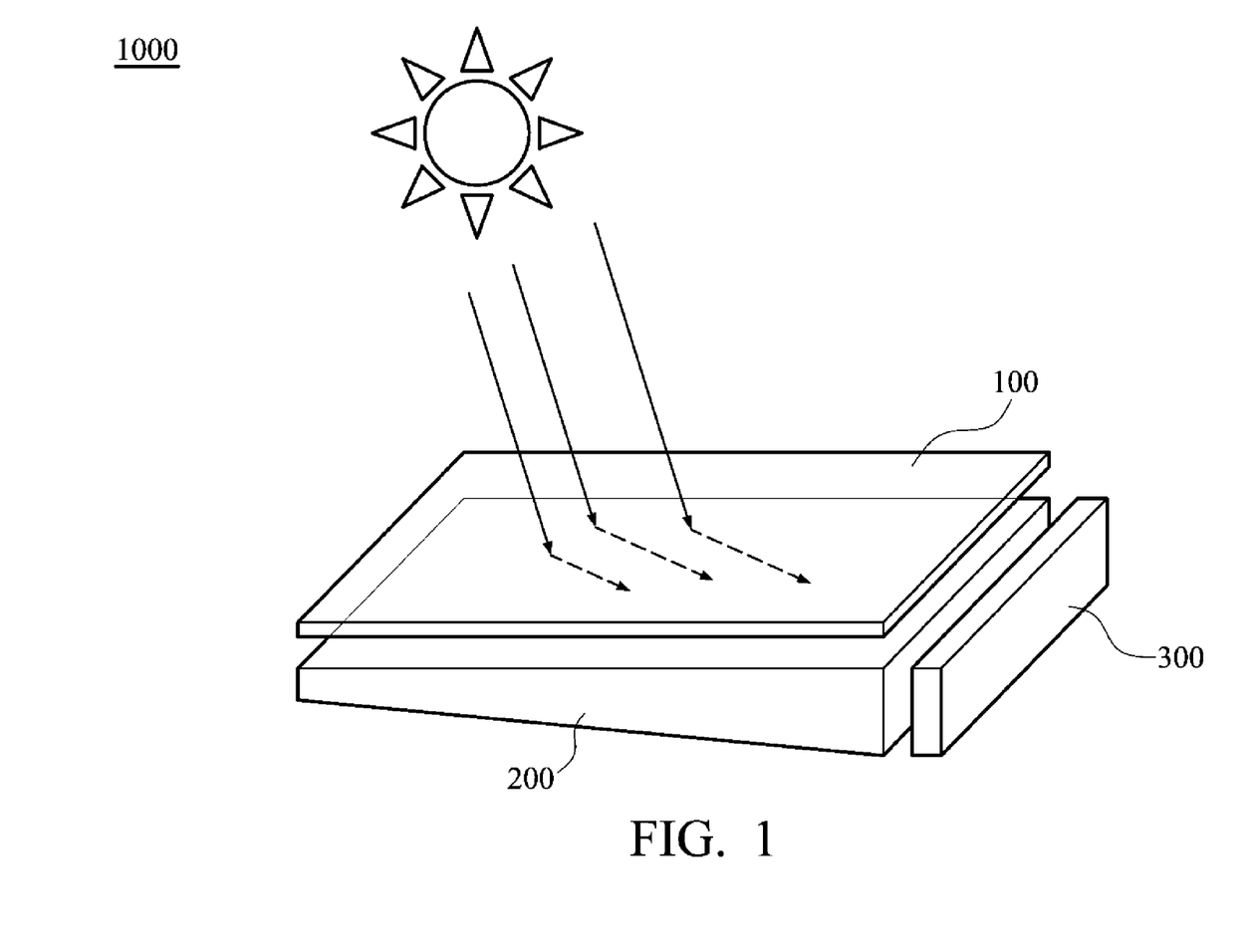
FIG. 1 is a schematic view of a light concentrating module of the invention.

Referring to FIG. 1, a light concentrating module 1000 of the invention comprises an optical film 100, an optical wedge plate 200 and a photoelectric chip 300.

Light from the sun or other light sources enter the optical film 100. The optical film 100 refracts the light to make the light enter the optical wedge plate 200 by an appropriate angle. The incident light propagates in the optical wedge plate 200 by total reflection. Finally, the light leaves the optical wedge plate 200 from a lateral surface thereof and is received by the photoelectric chip 300 near the lateral surface.

Figure 2:
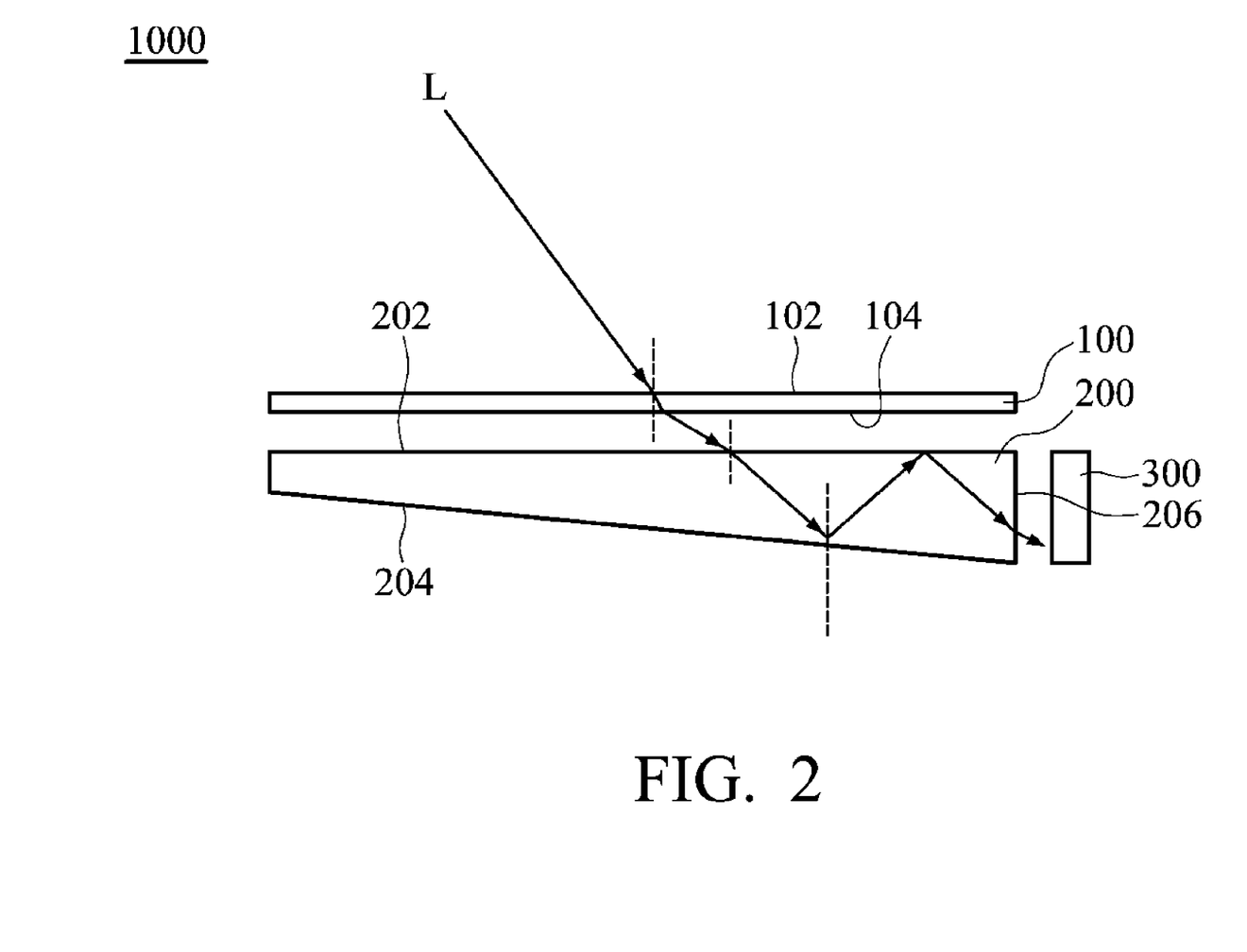
FIG. 2 is a side view of a light concentrating module of the invention.

Referring to FIG. 2, Light L enters a light incident surface 102 of the optical film 100 and leaves the optical film 100 from a light outgoing surface 104 which faces the light incident surface 102. In this embodiment, the light incident surface 102 is parallel to the light outgoing surface 104. A micro/nano scale structure is formed on the light incident surface 102 to reduce the light reflection on the light incident surface 102, whereby the light entering the optical film 100 is increased. A micro structure is formed on the light outgoing surface 104, whereby the light leaves the light outgoing surface 104 by an large refraction angle. Thus, the light has a large incident angle with respect to the optical wedge plate 200. The micro structure is described in the following paragraphs.

The optical wedge plate 200 has a first surface 202, a second surface 204 and a third surface 206. The first surface 202 faces the second surface 204 and is not parallel to the second surface 204. The first surface 202 has an angle with respect to the second surface 204. The third surface 206 is adjacent to the first surface 202 and the second surface 204. The light leaving the optical film 100 enters the first surface 202 and then reaches the second surface 204. Since an angle is between the first surface 202 and the second surface 204, the light reaches the second surface 204 by an angle larger than the critical angle of total reflection. The reflected light propagates in the optical wedge plate 200 by total reflection and leaves the optical wedge plate 200 from the third surface 206. The light is finally received by the photoelectric chips 300 near the third surface 206. The angle between the first surface 202 and the second surface 204 is larger than 0° and smaller than 80°.

To increase light entering the optical film 100, in this embodiment, a micro/nano scale structure with anti-reflective function can be formed on the light incident surface 102. In addition, since the light concentrating module 1000 can be applied to a window glass, a micro/nano scale structure with water repellent property can be formed on the light incident surface 102 or a water repellent material can be coated on the light incident surface 102 to prevent rain drops from attaching to the window glass. The water repellent material can be polyvinylidene fluoride, polysulfone, reactive modifying agent with a water-free polymer, silicon rubber, Acrylonitrile-Butadien-Styrene, or PTFE.

Figure 3:
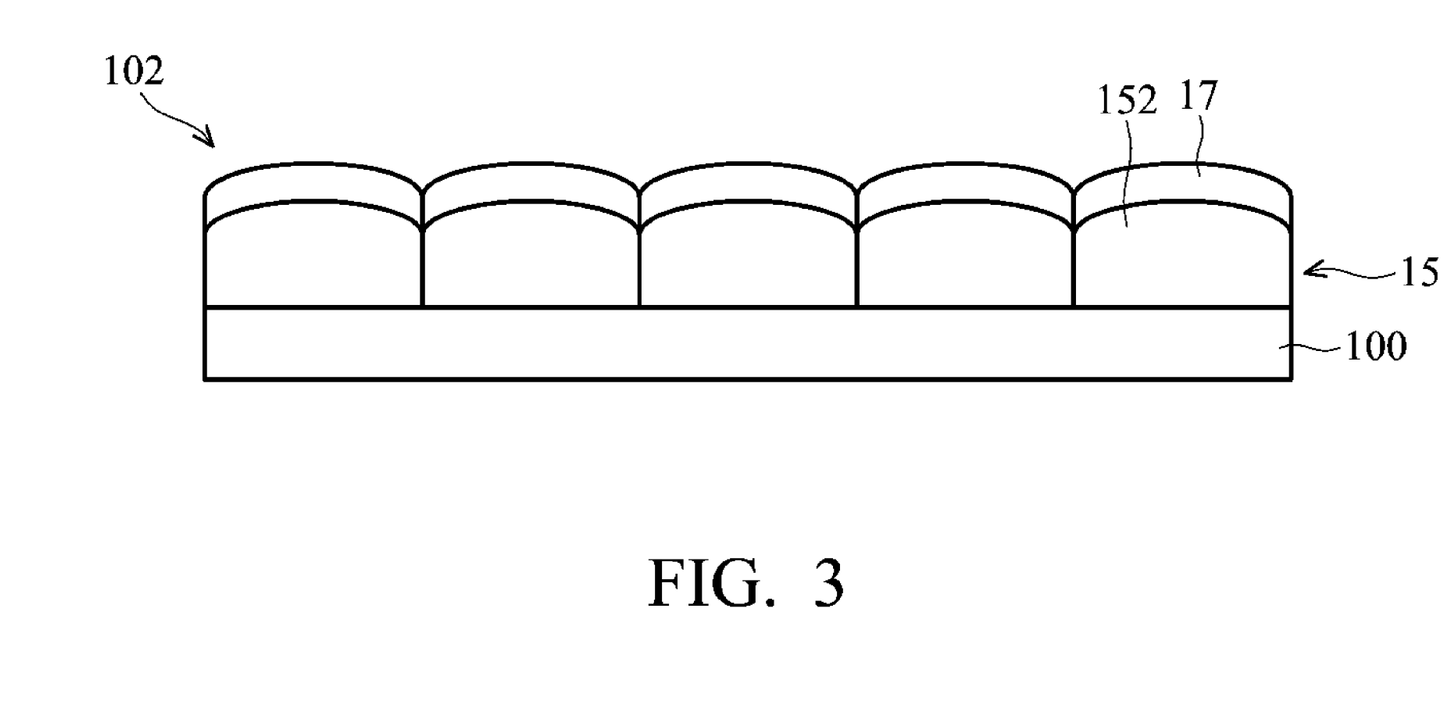
FIG. 3 depicts a micro/nano scale structure formed on a light incident surface of an optical film of the light concentrating module of the invention.

A micro/nano scale structure with anti-reflective or water repellent function is formed by a single-layer structure as shown in FIG. 3. A micro/nano layer 15 is formed on the optical film 100. A metal layer 17 is formed on the micro/nano layer 15. The micro/nano layer 15 comprises a three dimensional structure 152 with a cross section having a width gradually large from a top to bottom portion. The period of the three dimensional structure 152 is 100~600nm (the period indicates the distance of the top of one of the three dimensional structures 152 to the top of the next three dimensional structure 152), and the height is 100~750nm. The material of the metal layer 17 can be gold, silver, aluminum, nickel, copper, chromium, tin oxide or ITO. The thickness is less than 150nm.

The micro/nano layer 15 can be formed by the following method. The three dimensional mold is formed on the periphery of a roller by a lithography and etching process. A polymer substrate with high transparent property is provided. UV gel is coated on the surface of the polymer substrate. The polymer substrate is attached to the three dimensional mold and exposed to UV light, which hardens the UV gel. Finally the three dimensional structure 152 is formed. As many gaps exist between the three dimensional structure 152, rain drops contact a smaller area to reduce adhesive force, which provides the water repellent function. A metal layer 17 is formed on the micro/nano layer 15 to allow the light to penetrate and reduce the reflection rate on the inner side, which provides an anti-reflective function. A hard coated protective layer is formed on the metal layer 17 (not shown in FIG. 3).

Figure 4:
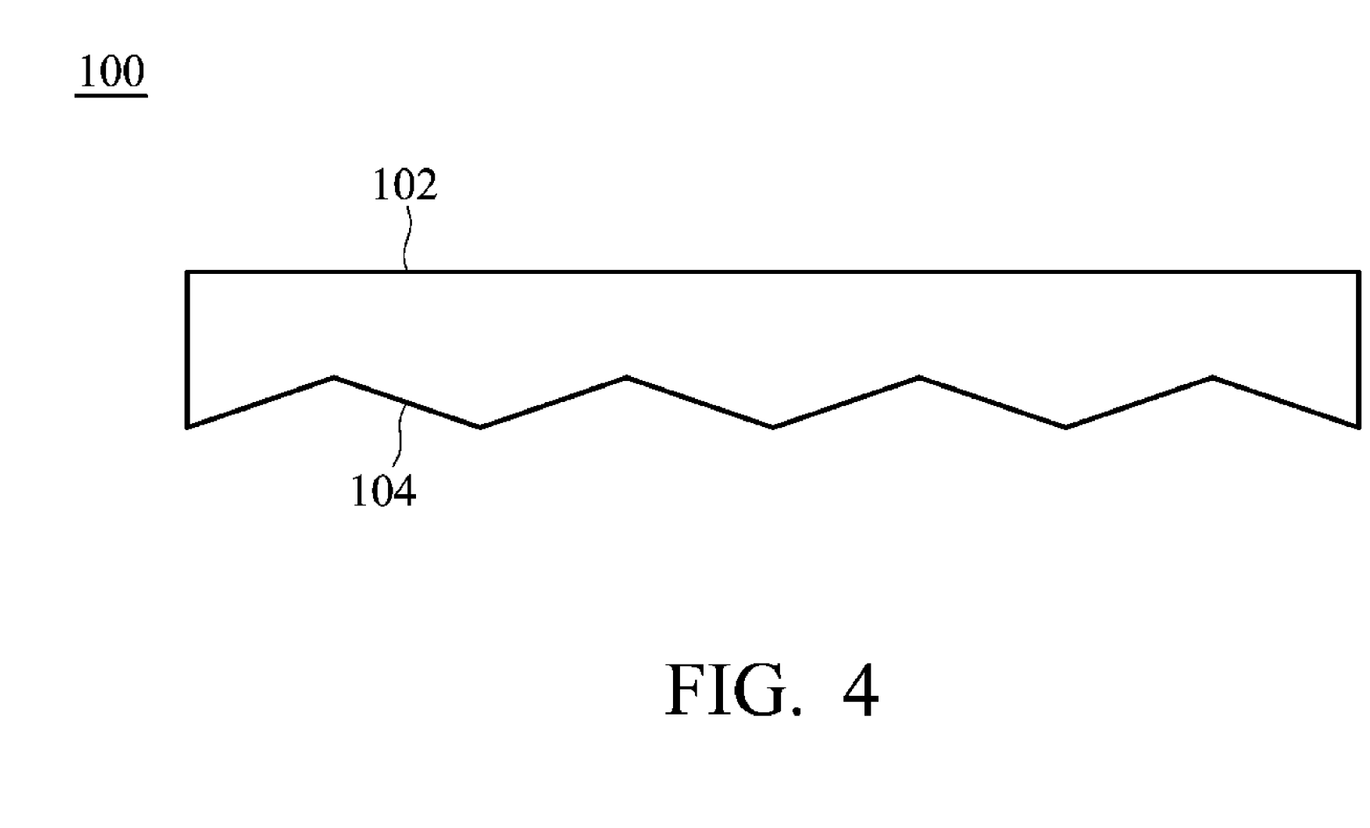
FIG. 4 depicts a micro structure having V-shaped cross section.
Figure 5:
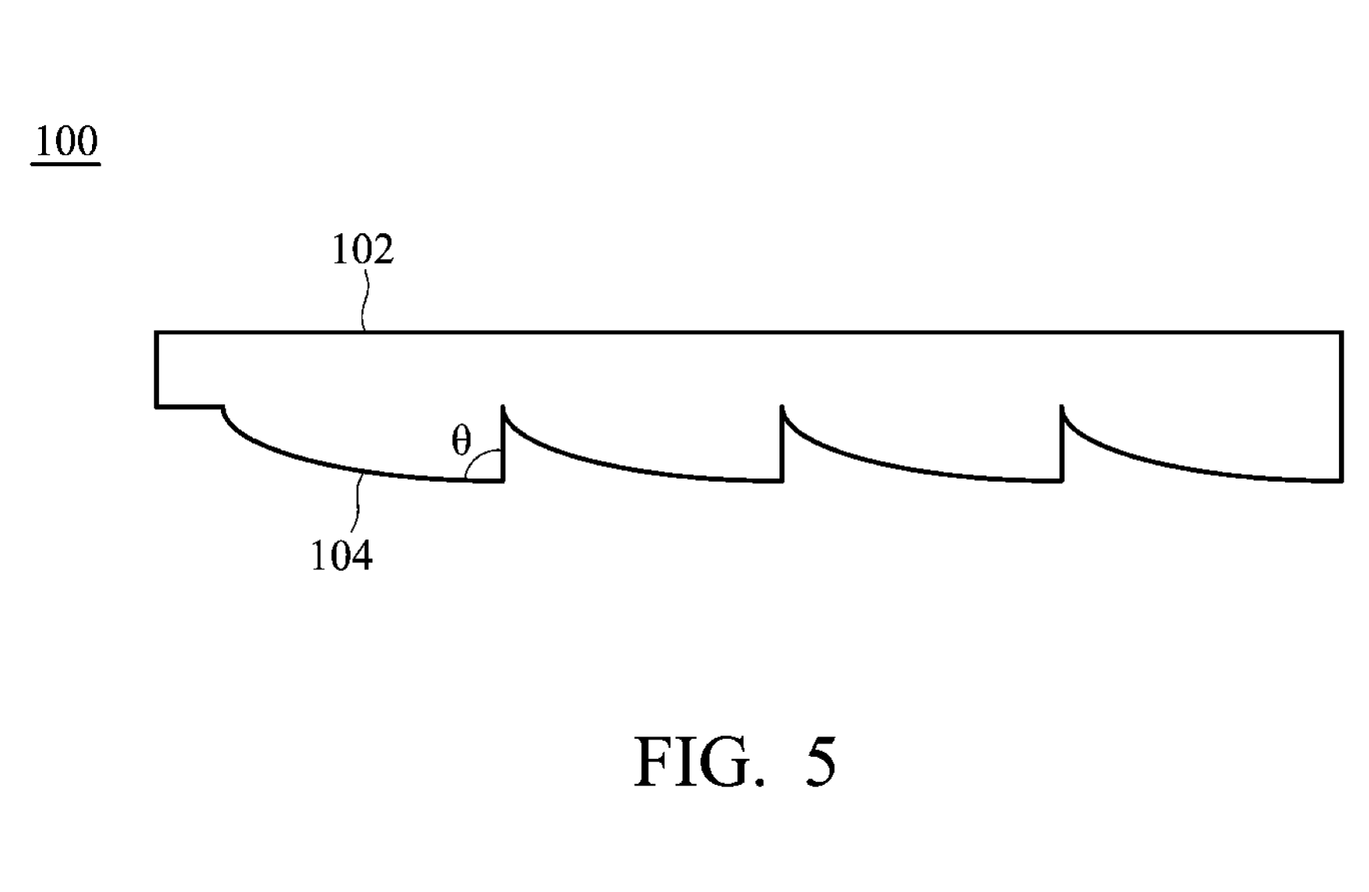
FIG. 5 depicts a micro structure having Fresnel lens.

To obtain a large incident angle for the light entering the first surface 202, a micro structure is formed on the light outgoing surface 104, as shown in FIGS. 4 and 5. FIG. 4 depicts the micro structure of V-shaped cross section (the optimal top angle is between 40° and 90°). FIG. 5 depicts the Fresnel lens structure. The Fresnel lens is formed by dividing a typical lens into several sections and eliminating the central portion which is the thickest part of a lens, whereby the thickness of lens is reduced but the focusing function is still maintained.

The Fresnel structure is formed on the light outgoing surface 104 by a roll-to-roll UV process. The angle θ in FIG. 5 is between 40° and 90°.

Figure 6:
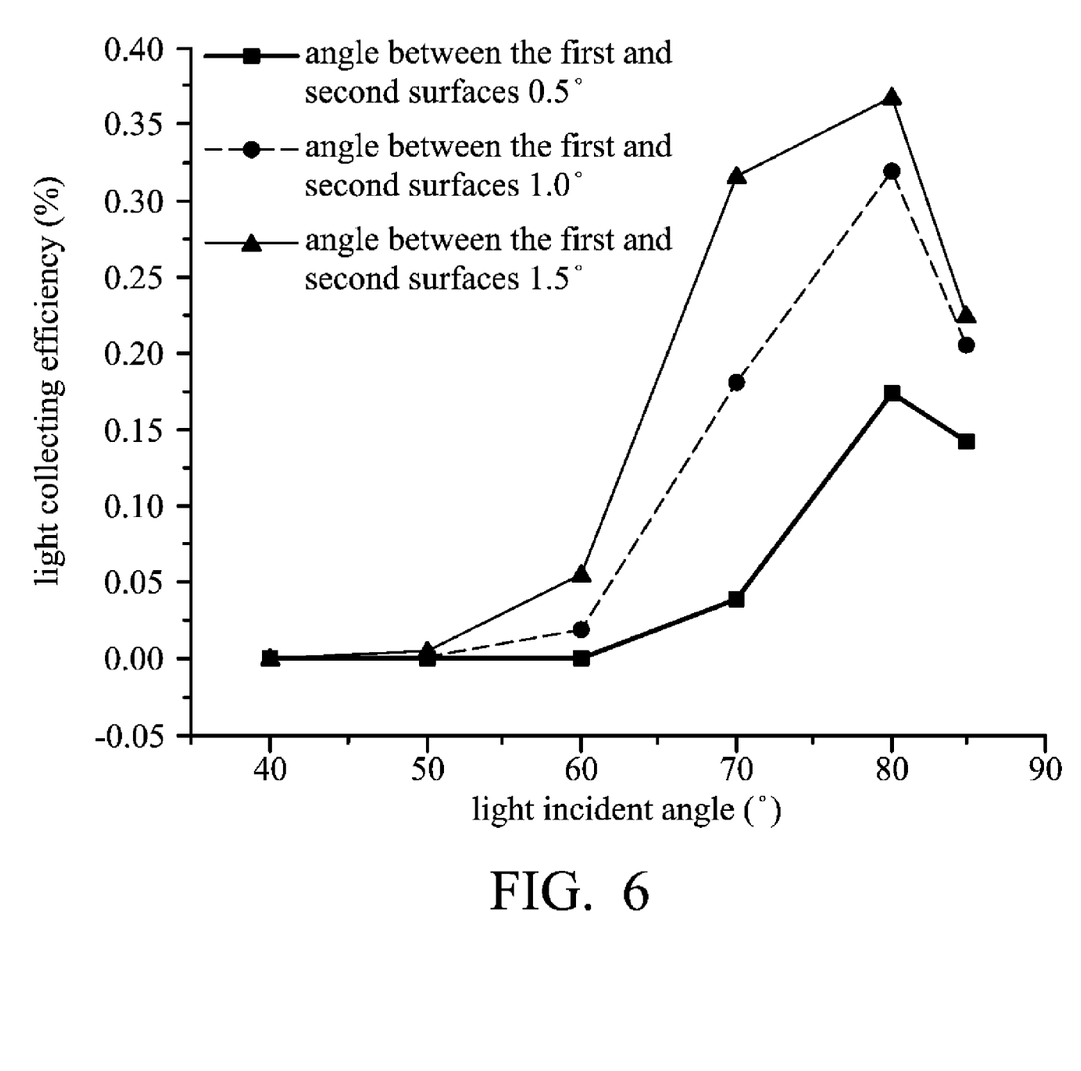
FIG. 6 shows the angle between the first surface and the second surface versus light collecting efficiency.

The relation between the angle of the first surface 202 and the second surface 204 and the light collection efficiency is described. The light collecting efficiency is the ratio of the light leaving the third surface 206 over the light entering the optical film 100. In this embodiment, the micro structure of the light outgoing surface 104 is the V-shaped groove as shown in FIG. 4. The top angle is 51°. FIG. 6 shows the relation between the angle of the first surface 202 and the second surface 204 and light collection efficiency. The traverse axis represents the angle of the first surface 202, and the longitudinal axis represents the light collation efficiency. There are three curves in FIG. 6, wherein ■ means the angle is 0.5°, ● means the angle is 1°, and ▲ means the angle is 1.5°. FIG. 6 shows that the larger the angle is, the better is the light collecting efficiency is. The large angle optical wedge plate is difficult to manufacture. For a panel of 8 inches, the angle is between 0° and 10°. In this embodiment, the distance from the optical film 100 to the optical wedge plate 200 is 1 μm to 1 mm, the depth of the V-shaped groove is 1 μm to 5 μm, and the top angle of the V-shaped groove is between 40° and 90°.

To increase the light collecting efficiency, the micro structure can also be formed on the third surface 206.

While the invention has been described by way of example and in terms of an embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light concentrating module, comprising an optical film having a light incident surface and a light outgoing surface facing the light incident surface;

an optical wedge element having a first surface, a second surface facing the first surface and having an angle with respect to the first surface and a third surface adjacent to the first and second surfaces;

at least one photoelectric chip disposed near the third surface, wherein light from a light source penetrates the optical film, and the light enters the first surface of the optical wedge element by an appropriate incident angle and has total reflection between the first and second surfaces, whereby the light propagates in the optical wedge element, and the light leaves the optical wedge element from the third surface and is received by the photoelectric chip;

a micro or nano meter structure formed on the light incident surface, and the micro or nano meter structure comprising a micro or nano meter layer formed on the optical film; and a micro meter structure formed on the light outgoing surface;

wherein the micro or nano meter layer comprises a plurality of three-dimensional structures with a cross section having a width that is gradually large from a top to bottom portion, wherein the three dimensional structure has a period of 100~600 nm and a height of 100~570 nm.

2. The light concentrating module as claimed in claim 1, wherein the angle between the first and second surfaces is larger than 0 degrees and smaller than 80 degrees.

3. The light concentrating module as claimed in claim 1, wherein the optical wedge element comprises transparent material.

4. The light concentrating module as claimed in claim 1, wherein the photoelectric chip comprises chemical elements selected from the group consisting of monocrystalline silicon, polycrystalline silicon, amorphous silicon, cadmium telluride, and copper indium selenide or sulfide.

5. The light concentrating module as claimed in claim 1, wherein a micro meter structure is formed on the third surface, and light passes through the micro meter structure to increase the light collected by the photoelectric chip.

6. The light concentrating module as claimed in claim 1, wherein the optical film comprises transparent material.

7. The light concentrating module as claimed in claim 1, wherein the micro or nano meter structure further comprises a metal layer formed on the micro or nano meter layer.

8. The light concentrating module as claimed in claim 7, wherein the metal layer comprises gold, silver, aluminum, nickel, copper, chromium, tin oxide or ITO.

9. The light concentrating module as claimed in claim 7, wherein the thickness of the metal layer is less than 150 nm.

10. The light concentrating module as claimed in claim 7, wherein the micro or nano meter structure further comprises a hard coating coated on the metal layer.

11. The light concentrating module as claimed in claim 1, wherein the light incident surface is coated by a water repellent material comprising polyvinylidene fluoride, polysulfone, reactive modifying agent with a water-free polymer, silicon rubber, Acrylonitrile-Butadien-Styrene, or PTFE.

12. The light concentrating module as claimed in claim 1, wherein the light leaves the optical film by an angle between the light and a normal line of the optical film larger than 50 degrees and smaller than 90 degrees.

13. The light concentrating module as claimed in claim 1, wherein the cross section of the micro meter structure is V-shaped.

14. The light concentrating module as claimed in claim 1, wherein the micro meter structure is Fresnel lens structure.

* * * * *